United States Patent
Foreman et al.

(10) Patent No.: US 8,856,709 B2
(45) Date of Patent: *Oct. 7, 2014

(54) SYSTEMS AND METHODS FOR CORRELATED PARAMETERS IN STATISTICAL STATIC TIMING ANALYSIS

(71) Applicant: International Business Machines Corporation, Armonk, NY (US)

(72) Inventors: Eric A. Foreman, Fairfax, VT (US); Peter A. Habitz, Hinesburg, VT (US); David J. Hathaway, Underhill, VT (US); Jeffrey G. Hemmett, St. George, VT (US); Natesan Venkateswaran, Hopewell Junction, NY (US); Chandramouli Visweswariah, Croton-on-Hudson, NY (US); Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/138,935

(22) Filed: Dec. 23, 2013

(65) Prior Publication Data

US 2014/0115552 A1 Apr. 24, 2014

Related U.S. Application Data

(63) Continuation of application No. 13/190,083, filed on Jul. 25, 2011, now Pat. No. 8,707,233.

(51) Int. Cl.
*G06F 9/455* (2006.01)
*G06F 17/50* (2006.01)

(52) U.S. Cl.
CPC ........ *G06F 17/5031* (2013.01); *G06F 17/5081* (2013.01)
USPC .......................................................... 716/113

(58) Field of Classification Search
CPC . G06F 17/5031; G06F 2217/84; G06F 17/50; G06F 17/5045; G06F 2217/12; G06F 2217/62; G06F 17/5081; G06F 1/10; G01R 31/31725; G01R 31/31727; G01R 31/318328
USPC .................................. 716/108–113; 703/19
See application file for complete search history.

(56) References Cited

U.S. PATENT DOCUMENTS

| | | |
|---|---|---|
| 6,487,701 B1 | 11/2002 | Dean et al. |
| 6,857,110 B1 | 2/2005 | Rupp et al. |
| 6,990,645 B2 | 1/2006 | Lichtensteiger et al. |

(Continued)

OTHER PUBLICATIONS

"STAC: Statistical timing Analysis with Correlation", by Jiayon le, Xin Li, and Lawrence T. Pileggi, DAC 2004, Jun. 1-11, 2004.*

(Continued)

*Primary Examiner* — Nha Nguyen
(74) *Attorney, Agent, or Firm* — David Cain; Roberts Mlotkowski Safran & Cole, P.C.

(57) ABSTRACT

Systems and methods for accommodating correlated parameters in SSTA are provided. The method includes determining a correlation between at least two parameters. The method further includes calculating a new parameter or a new parameter set based on the correlation between the at least two parameters. The method further includes performing the SSTA such that the new parameter or the new parameter set is propagated into the SSTA. The method further includes projecting slack using the correlation between the at least two parameters and using a processor.

16 Claims, 8 Drawing Sheets

(56) References Cited

U.S. PATENT DOCUMENTS

| | | | |
|---|---|---|---|
| 7,117,466 | B2 | 10/2006 | Kalafala et al. |
| 7,458,049 | B1 * | 11/2008 | Tuncer et al. ............ 716/113 |
| 7,475,366 | B2 | 1/2009 | Kuemerle et al. |
| 7,539,893 | B1 | 5/2009 | Ferguson |
| 7,840,925 | B1 | 11/2010 | Lujan et al. |
| 2006/0085775 | A1 | 4/2006 | Chang et al. |
| 2006/0100873 | A1 | 5/2006 | Bittner et al. |
| 2007/0089078 | A1 | 4/2007 | Engel et al. |
| 2007/0277134 | A1 | 11/2007 | Zhang et al. |
| 2008/0034337 | A1 | 2/2008 | Kuemerle et al. |
| 2008/0059143 | A1 | 3/2008 | Chiu et al. |
| 2008/0168297 | A1 * | 7/2008 | Haussler et al. ............ 713/502 |
| 2009/0013294 | A1 | 1/2009 | Visweswariah |
| 2009/0222775 | A1 * | 9/2009 | Idgunji et al. ............ 716/5 |
| 2009/0327989 | A1 | 12/2009 | Zhuoxiang |
| 2010/0115475 | A1 | 5/2010 | Buonpane et al. |
| 2011/0040548 | A1 | 2/2011 | Khalily et al. |
| 2011/0055793 | A1 | 3/2011 | Buck et al. |
| 2011/0106497 | A1 | 5/2011 | Visweswariah et al. |

OTHER PUBLICATIONS

Yu et al., "A Multiple Supply Voltage Based Power Reduction Method in 3-D ICs Considering Process Variations and Thermal Effects", Department of Communications Engineering, IEEE, 2009, pp. 55-60.

Siemens AG, " Improved path selection method to enable usability of path based SSTA", Infineon Technologies, IP.com, IPCOM000160545D, Dec. 13, 2007, 4 pages.

IBM, "Method and System for Adaptive Voltage Management for Parts of a Product", IP.com, IPCOM000193607D, Mar. 5, 2010, 3 pages.

Le et al., "STAC: Statistical Timing Analysis with Correlation", DAC 2004, pp. 343-348.

Singh et al., "A Scalable Statistical Static Timing Analyzer Incorporating Correlated Non-Gaussian and Gaussian Parameter Variations", IEEE Transactions on Computer-Aided Design of Intergrated Circuits and Systems, vol. 27, No. 1 Jan. 1, 2008, pp. 160-173.

"Variation-Aware Supply Voltage Assignment for minimizing Ciucuit Degradation and Leakage", Xiaoming Chen, Yu Wang, Yu Cao, Yuchun Ma, and Huazhong Yang, @2009 ACM.

Office Action dated Jan. 15, 2014 in related U.S. Appl. No. 13/780,413, 18 pages.

Notice of Allowance dated May 1, 2014 in related U.S. Appl. No. 13/780,413, 5 pages.

* cited by examiner

SYSTEMS AND METHODS FOR CORRELATED PARAMETERS IN STATISTICAL STATIC TIMING ANALYSIS

FIELD OF THE INVENTION

The invention relates to statistical static timing analysis and, more particularly, to systems and methods for accommodating correlated parameters in statistical static timing analysis (SSTA).

BACKGROUND

It is commonly recognized that electrical characteristics of transistors and interconnects are not the same for different chips and even for the same chip at different periods of time or chip locations. Variation of electrical characteristics can be due to variation of process parameters, changing of environmental conditions and even chip age (e.g., Hot Carriers Injections, Negative Bias Temperature Instability, electromigration, and so forth).

The variation of electrical characteristics results in variations of gate timing characteristics. The traditional conservative way to handle these variations is to consider so-called process corners at which the gates have the worst combinations of delays. Then chips are designed so that they can properly function at all process corners assuming that as a result they will function at any other combination of gate delays.

However, with decreasing transistor size and interconnect width, the variation of electrical characteristics is becoming proportionally larger. Therefore, the approach to design for process corners results in too conservative and non-optimal designs because most design efforts and chip resources are spent to make chips function at very low-probability combinations of electrical characteristics.

An alternative approach to designing chips is to consider actual statistical characteristics of process parameter variations and use them to compute statistical characteristics of a designed circuit. For digital circuits, this approach is known as statistical timing analysis. There are several varieties of statistical timing analysis.

One of the most useful for circuit analysis and optimization is parameterized statistical static timing analysis (SSTA). According to this technique, gate delays and signal arrival times are represented as functions of process parameters. All the parameters are assumed independent. This assumption significantly simplifies the analysis but does not limit its applicability because independence can be obtained by a principal component analysis technique. Using this representation, the parameterized SSTA computes a statistical approximation of the circuit timing characteristics (arrival and required arrival times, delay, timing slack) as functions of the same parameters.

The parameterized SSTA can be either path-based or block-based. Path-based statistical SSTA analyzes each signal propagation path separately and computes the probability distribution for circuit delay as the probabilistic maximum of all paths delays. Usually this requires enumeration of all signal propagation paths and integration in the space of parameters variations, which can be an inefficient computational procedure.

A more efficient technique of parameterized SSTA is so-called block-based SSTA. This technique is very similar to traditional deterministic static timing analysis (STA). For example, block-based SSTA computes signal arrival times (or signal required arrival times) as functions of process parameters for each circuit node in their topological order similarly to propagating arrival times by a deterministic STA. This type of timing analysis lends itself to incremental operation, whereby after a change of the circuit is made, timing can be queried efficiently.

Block-based SSTA assumes that all parameters variations have normal Gaussian distributions and that gate and wire delays depend on parameters linearly. Linear and Gaussian assumptions are very convenient for parameterized SSTA because it is possible to use approximate analytical formulae for computing canonical forms of arrival times. The use of analytical formulae can make parameterized SSTA fast, which is important for implementing a statistical approach in circuit synthesis and optimization. Unfortunately, the use of statistical parameterized SSTA to model process variation can be computationally inefficient at times and provide overly pessimistic results.

Accordingly, there exists a need in the art to overcome the deficiencies and limitations described hereinabove.

SUMMARY

In a first aspect of the invention, a method is provided for accommodating correlated parameters in statistical static timing analysis (SSTA). The method further comprises determining a correlation between at least two parameters. The method further comprises calculating a new parameter or a new parameter set based on the correlation between the at least two parameters. The method further comprises performing the SSTA such that the new parameter or the new parameter set is propagated into the SSTA. The method further comprises projecting slack using the correlation between the at least two parameters and using a processor.

In another aspect of the invention, a computer system is provided for accommodating correlated parameters in statistical static timing analysis (SSTA). The system further comprises a CPU, a computer readable memory and a computer readable storage media. The system further comprises first program instructions to determine a correlation between at least two parameters. The system further comprises second program instructions to calculate a new parameter or new parameter set based on the correlation between the at least two parameters. The system further comprises third program instructions to perform the SSTA such that the new parameter or the new parameter set is propagated into the SSTA. The system further comprising fourth program instructions to project slack using the correlation between the at least two parameters. The system further comprises the first, second, third, and fourth program instructions are stored on the computer readable storage media for execution by the CPU via the computer readable memory.

In yet another aspect of the invention, a computer program product is provided comprising a computer usable storage medium having readable program code embodied in the storage medium. The computer program product includes at least one component operable to create a correlation between a process and a process parameter. The computer program product includes at least one component further operable to compute a SSTA for a netlist of an integrated circuit. The computer program product includes at least one component further operable to use capabilities of statistical timing to model the correlated process and process parameter. The computer program product includes at least one component further operable to use a correlation coefficient to model voltage adjustment according to the process parameter.

In yet another aspect of the invention, a method is provided for accommodating correlated parameters in statistical static timing analysis (SSTA). The method further comprises creating a correlation between a process and a process parameter. The method further comprises calculating a correlation coefficient for the process and the process parameter. The method further comprises calculating a new parameter that is a linear combination of the process and the process parameter. The method further comprises computing a SSTA for a netlist of an integrated circuit with the new parameter. The method further comprises using the new parameter to project slack of the integrated circuit.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
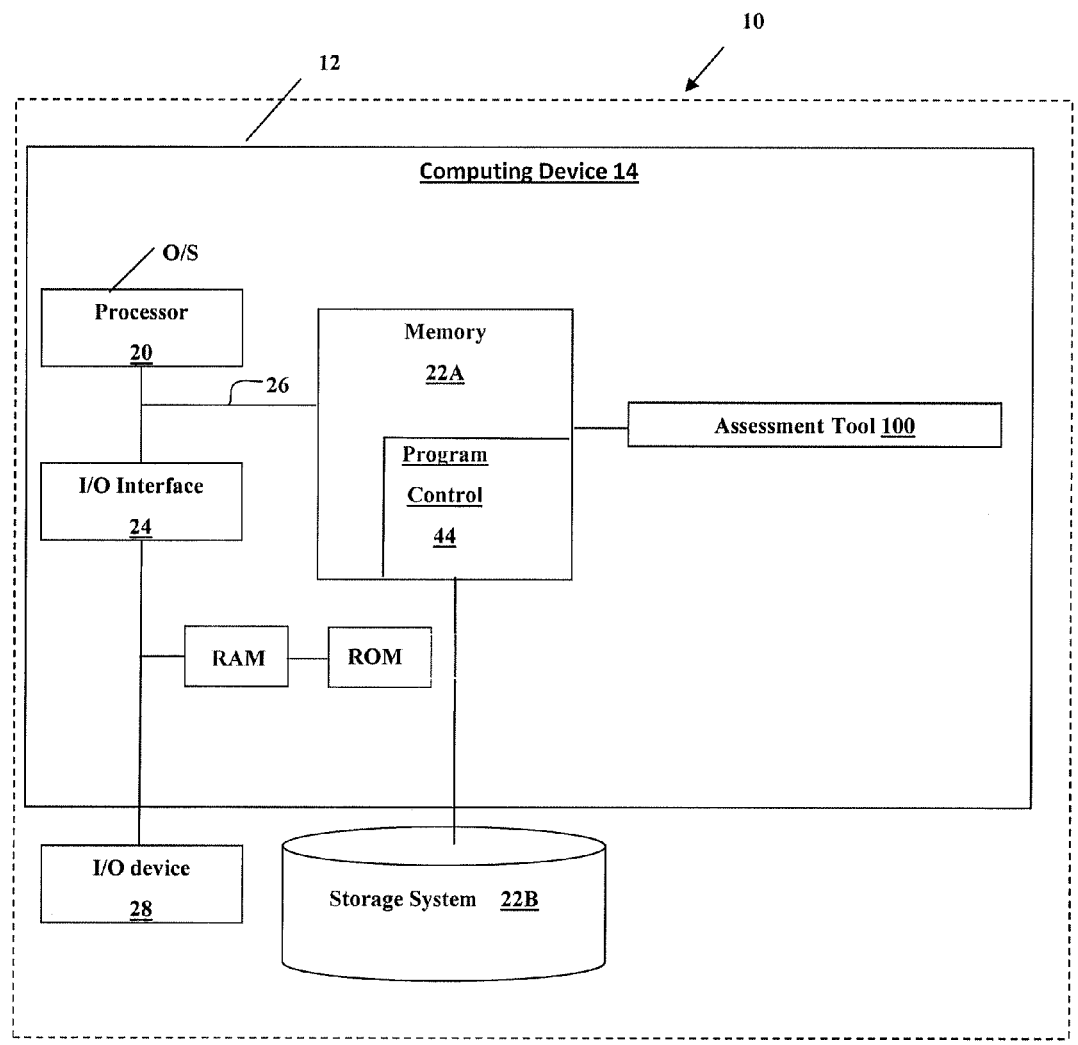
FIG. 1 is an illustrative external environment for implementing the invention in accordance with aspects of the invention.

The invention relates to statistical static timing analysis and, more particularly, to systems and methods for accommodating correlated parameters in SSTA. More specifically, implementations of the invention provide a method for efficient slack projection by using a correlation between at least two parameters, e.g., an anti-correlation between voltage and process parameters, in SSTA. In embodiments, a covariance matrix is generated for the at least two parameters to compute a new parameter or new parameter set, which can then be used for the efficient slack projection. Advantageously, the system and method for efficient slack projection improves performance of timing analysis by closing to a less pessimistic timing slack, and by reducing memory and runtime resources when performing the timing analysis of an integrated circuit. More advantageously, the system and method can drive optimization to use a smaller sensitivity to sigma-limited process parameters. Additionally advantages include the ability of providing a faster and more efficient computational means of computing projected slacks than with specifying each corner in a subspace.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with the external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard, etc.

In general, the processor 20 executes computer program code (e.g., program control 44), which can be stored in the memory 22A and/or storage system 22B. Moreover, in accordance with aspects of the invention, the program control 44 controls an assessment tool 100 to perform the processes described herein. The assessment tool 100 can be implemented as one or more program code in the program control 44 stored in memory 22A as separate or combined modules. Additionally, the assessment tool 100 may be implemented as separate dedicated processors or a single or several processors to provide the function of this tool. While executing the computer program code, the processor 20 can read and/or write data to/from memory 22A, storage system 22B, and/or I/O interface 24. The program code executes the processes of the invention. The bus 26 provides a communications link between each of the components in the computing device 14.

In embodiments, the assessment tool 100 can identify a correlation between at least two parameters and provide a covariance matrix comprising the at least two parameters for SSTA timing analysis and, thereafter, provide an efficient slack projection. For example in accordance with aspects of the invention, the assessment tool 100 can provide a correlation between at least two parameters by looking up correlations based on a design structure, calculate a new parameter or a new parameter set based on the correlated at least two parameters, compute an SSTA that propagates the new parameter or new parameter set, specify a root sum of squares (RSS) list that includes the new parameter or the new parameter set, project the slack of the design structure taking into consideration the new parameter or the new parameter set, and generate reports comprising the slack projection.

Flow Diagram

Figure 2:
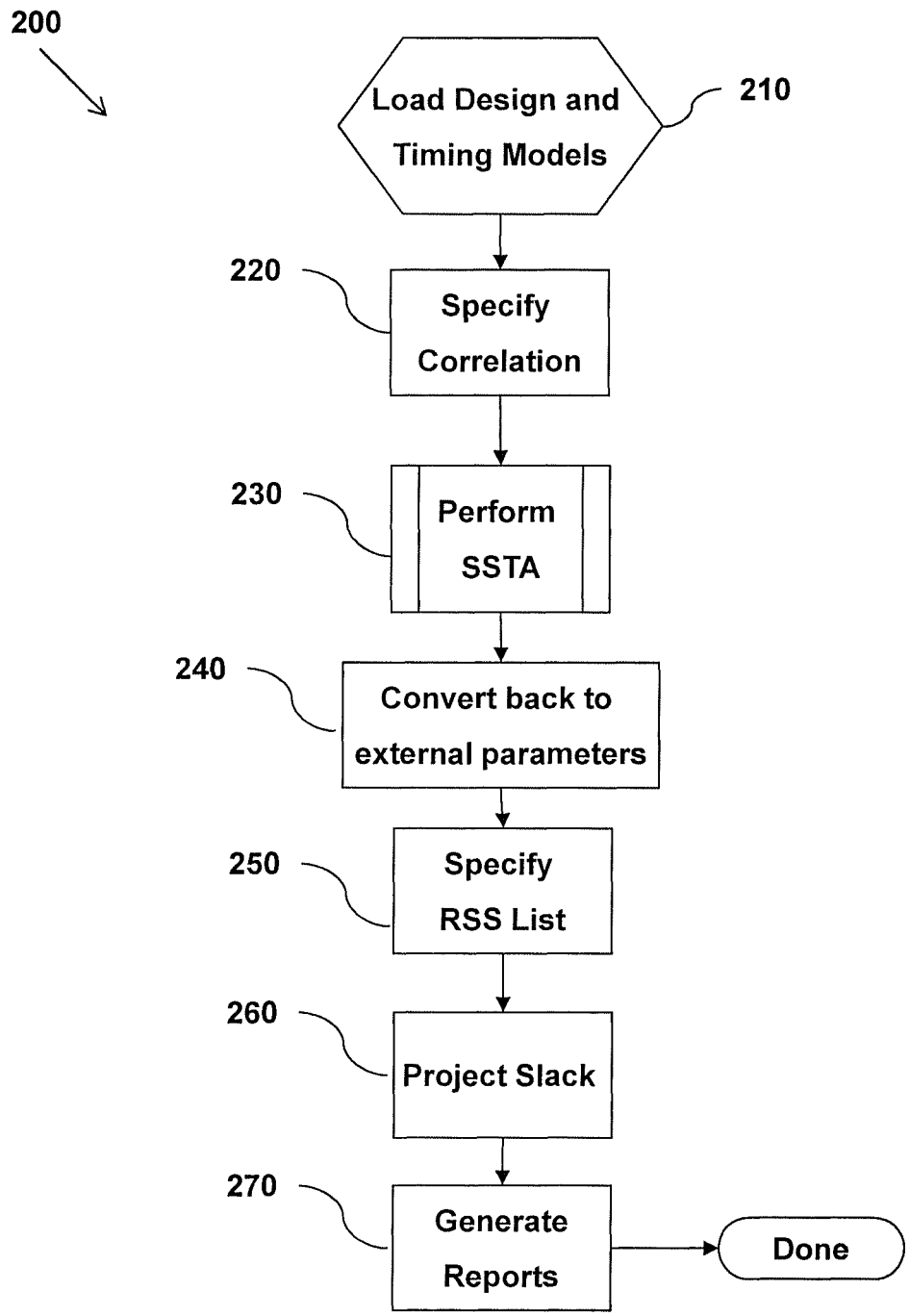
FIG. 2 is an illustrative process flow of implementing the system in accordance with aspects of the invention.
Figure 4:
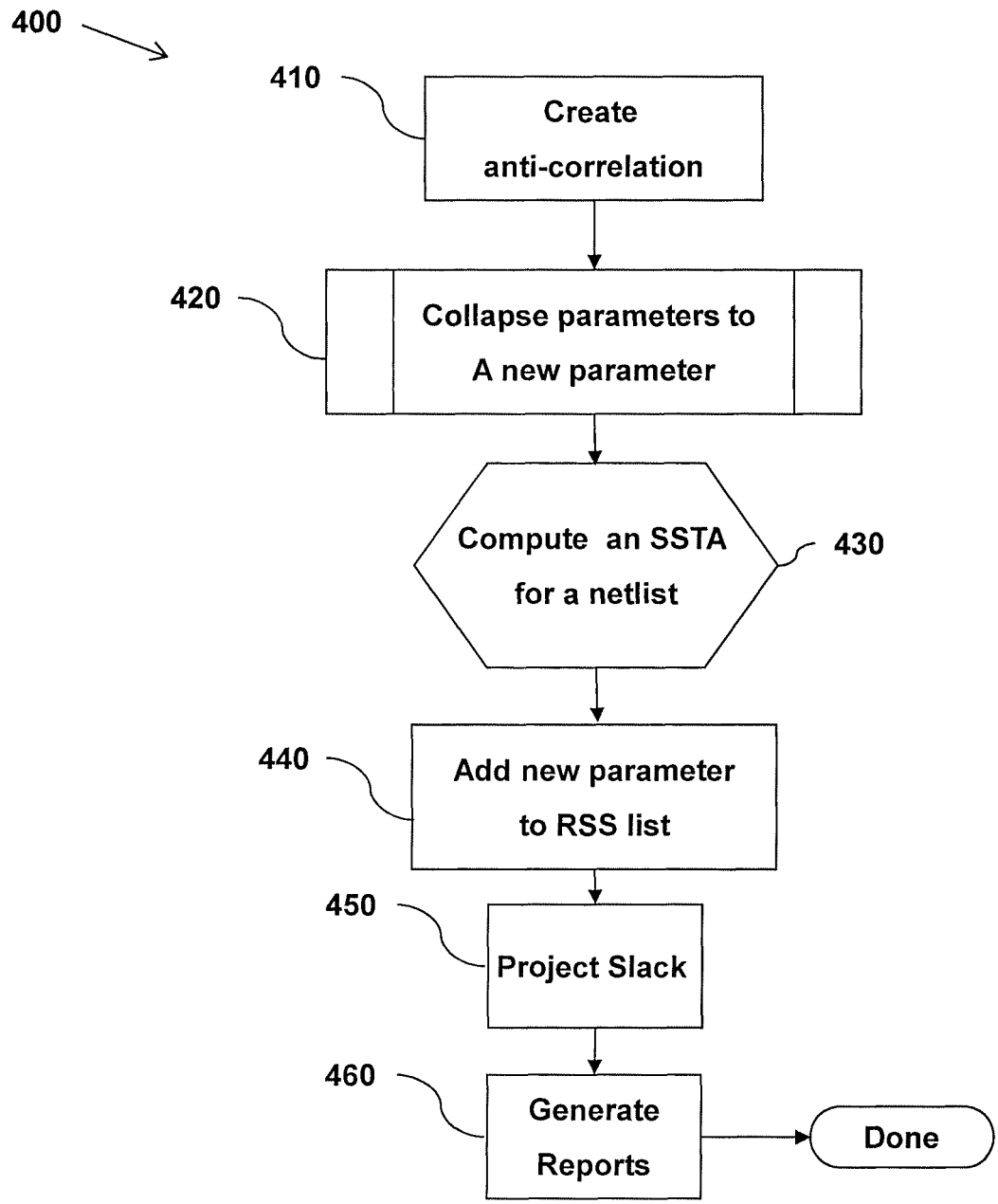
FIG. 4 is an illustrative process flow of implementing the system in accordance with aspects of the invention.

FIGS. 2 and 4 show an exemplary flows for performing aspects of the present invention. The steps of FIGS. 2 and 4 may be implemented in the environment of FIG. 1, for example.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

In embodiments, as shown in FIG. 2, a covariance matrix may be generated for at least two parameters of an integrated circuit or specified testing regions of the integrated circuit to compute a new parameter or a new parameter set, which can then be used for efficient slack projection of the integrated circuit or specified testing regions of the integrated circuit. In accordance with aspects of the invention, the system and method of SSTA 200 for efficient slack projection may use statistical timing to model process variation of the integrated circuit or specified testing regions of the integrated circuit.

At step 210, design and timing models for an integrated circuit or specified testing region of the integrated circuit may be loaded into a computing device. For example, a design structure and timing models for an integrated circuit or specified region of the integrated circuit may be loaded into assessment tool 100 (as discussed with regard to FIG. 1).

At step 220, a correlation between at least two parameters may be determined or specified, and a new parameter or a new parameter set may be calculated based on the linear combination of the at least two parameters. For example, a user or the assessment tool 100 may determine or specify a correlation or anti-correlation between at least two parameters of the integrated circuit. In embodiments, the correlation or anti-correlation may be determined by the assessment tool looking up correlations or anti-correlations based on the design structure. For example, the correlation or anti-correlation may be determined or specified by: (1) the physics of the devices in the design structure, (2) the manufacturing process of the design structure, or (3) the design structure architecture, such as, the implementation of voltage and temperature regulators that are designed to regulate the integrated circuit based on a defined relationship.

In embodiments, the assessment tool 100 may then generate a covariance matrix indicative of the correlated at least two parameters. For example the covariance matrix may include a combination of correlation coefficients for the at least two parameters. In accordance with aspects of the invention, the correlation coefficients ($\rho$) may be calculated using the following formula (1).

$$\rho(x, y) = \frac{E(x, y) - E(x)E(y)}{\sigma_x \sigma_y} = \Re; \neq 0 \quad (1)$$

where:
x=the first parameter;
y=the second parameter;
E=an expected value;
σ=a standard deviation; and
$\Re$ =real numbers.

In embodiments, a new parameter "X" that is a linear combination of the at least two parameters or a new parameter set "X1" and "X2" that is a transformation of the at least two parameters may then be calculated using the following formula (2). For example, if the at least two parameters have 100% correlation, then they reduce to one parameter "X." However if the at least two parameters have a correlation not equal to 100%, then there will be two new parameters or a new parameter set calculated (e.g., this is referred to as parameter transform). In embodiments, if you have 100% correlation, where $\rho=1$ or $\rho=-1$, then you have the parameters collapse into a single parameter.

If $\rho=1$ or $-1$, then $X=\alpha_1 y+\beta_1 z$ (Parameter Collapsing)

If $\rho \neq 1$ or $-1$, then $X1=\alpha_1 y+\beta_1 z$ and $X2=\alpha_2 y+\beta_2 z$ (Parameter Transforming) (2)

where:
$\alpha_1$=a multiplier for linear combination sensitivities;
$\beta_1$=a multiplier for liner combination sensitivities;
$\alpha_2$=a multiplier for linear combination sensitivities;
$\beta_2$=a multiplier for liner combination sensitivities;
y=the first parameter; and
z=the second parameter.

At step 230, an SSTA may be performed for the design structure that propagates the new parameter "X" or the new parameter set "X1" and "X2" into the timing analysis. For example, an SSTA for the integrated circuit may be performed that computes a statistical approximation of the circuit timing characteristics, e.g., arrival times, required arrival times, delay, and timing slack, as functions of the same parameters. Specifically, canonical delays may be calculated and then propagated to obtain arrival times, required arrival times, and timing slack that take into consideration the new parameter "X" or the new parameter set "X1" and "X2" rather than the at least two parameters separately. The general calculating of the SSTA for the design structure would be known to one of ordinary skill in the art such that further explanation is not required.

At step 240, the new parameter "X" or the new parameter set "X1" and "X2" may be returned back to the original at least two external parameters for slack projection. At step 250, an RSS list may be specified to include the new parameter "X" or the new parameter set "X1" and "X2". For example, the RSS list may be specified for statistical sources of variation or standard deviation including the new parameter. The RSS list provides a reduction in overall variance or standard deviation. In embodiments, the RSS list may not be specified in the instances of non-statistical sources of variation or standard deviation. The providing of an RSS list for the design structure would be known to one of ordinary skill in the art such that further explanation is not required.

At step 260, slack may be projected for the design structure. In accordance with aspects of the invention, the slack associated with each connection of the design structure is the difference between the required arrival time and the arrival time. A positive slack at a node implies that the arrival time at that node may be increased by the positive slack without affecting the overall delay of the circuit. Conversely, negative slack implies that a path is too slow, and the path must be sped up (or the reference signal delayed) if the whole circuit is to work at the desired speed. For example, the assessment tool 100 may take into consideration the correlated or anti-correlated parameters affect on the required arrival time and the arrival time and efficiently project the slack using the following formula (3). In embodiments, since the new parameter "X" or the new parameter set "X1" and "X2" may be returned back to the original at least two external parameters in step 240, then an additional variance adder is included in the square root. Accordingly, the additional variance is computed by correlation coefficient*sensitivity of correlated parameter 1 and * sensitivity of correlated parameter 2. In formula (3), ai1 and ai2 are the correlated sensitivities.

$$a_0 - 3 \sum_{Environment} |a_i^{Env}| - \qquad (3)$$

$$3 \left\{ \sum_{RSS\_LIST} \left(a_i^{RSS\_LIST}\right)^2 + \sum_{CorrelationList} |\rho| * a_{i1} * a_{i2} \right\}^{1/2}$$

At step 260, reports may be generated. For example, the assessment tool 100 may generate reports comprising any timing quantity including the required arrival times, the arrival times, the slack projection, and the transition time or slew rate for the design structure obtained from the SSTA.

In accordance with aspects of the invention, the inventive system and method of SSTA 200 will now be discussed in detail as it pertains to an exemplary use in integrated circuit manufacturing. For example, the system and method of SSTA 200 may be used for selective voltage binning (SVB) during integrated circuit manufacturing. Those of ordinary skill in the art should understand that the use of the system and method of SSTA 200 for SVB is merely illustrative of one exemplary use and that other uses for the system and method of SSTA 200 are contemplated by the invention, all of which do not depart from the scope and spirit of the invention.

SVB is a performance screen ring oscillator (PSRO)-based screening process of high performance chips into process or voltage bins. SBV takes into consideration that chip performance and chip leakage depend on supply voltage of the chip, and that dependency can be used to convert slow or leaky chips into acceptable chips by tweaking the supply voltage. In SVB, the manufactured chips are tested using oscillator rings for an average frequency of the chip. Bins are assigned a range of frequencies or a supply voltage necessary for compensating for the slow or fast frequencies, and the tested chips are placed into corresponding bins. The supply voltage of each chip in the corresponding bins may be adjusted using a voltage regulator to compensate for process effect to chip performance and leakage. For example, the supply voltage may be increased when the process parameter decreases.

This anti-correlation between supply voltage and the process parameter used in SVB can be used within the system and method of SSTA 200 to compute a new parameter in place of the supply voltage and process parameter, and the new parameter can be used for efficient slack projection. Specifically, the supply voltage and process parameter form a joint probability distribution such that when the parameters are anti-correlated a smaller subspace of distribution is achieved than when the parameters are not correlated. Advantageously, this correlation can be used to drive optimization to use a smaller sensitivity to sigma-limited process parameters. For example, by using the system and method of SSTA 200 to compute a new correlated parameter in place of the supply voltage and process parameter, there are fewer amounts and less complex work required for the SVB processes, and narrower bins or ranges of frequencies can be achieved.

Figure 3:
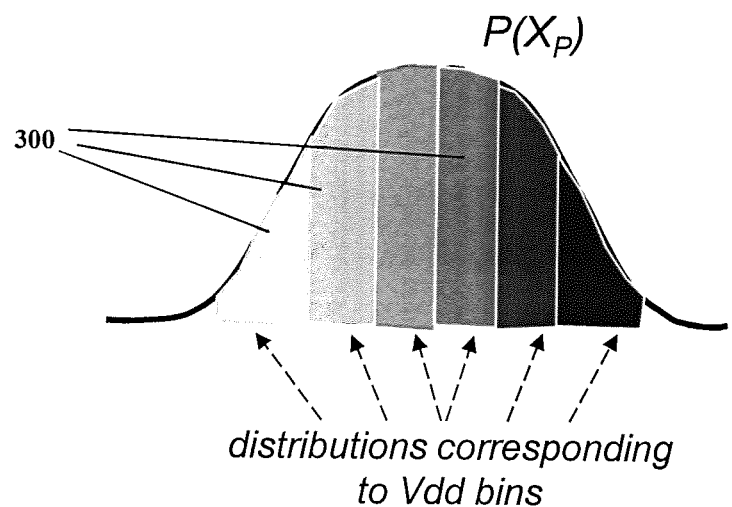
FIG. 3 is an illustration that shows an exemplary selective voltage binning distribution in accordance with aspects of the invention.

FIG. 3 shows an example of SVB in accordance with aspects of the invention. Multi-bin SVB may use many different narrow bins 300, e.g., 16 or more bins. The narrower bins may make compensation for process effects more precise and improves the efficiency of the SVB process. However, the narrower bins make timing sign-off more challenging to compute. Nonetheless, as the number of bins increase, the anti-correlation between voltage and process becomes −1. In fact, at 16 bins, it can be assumed to be 100% anti-correlated. Accordingly, applying the system and method of SSTA 200 for efficient slack projection in accordance with aspects of the invention, it is possible to efficiently perform statistical timing analysis for the large number of narrower bins in a single timing run, as discussed in detail below.

In embodiments, as shown in FIG. 4, the system and method of SSTA 400 may use the anti-correlation between supply voltage and the process parameter to compute a new parameter, which can then be used for efficient slack projection. At step 410, a covariance matrix comprising the anti-correlation between the supply voltage and the process parameter may be created. For example, the capabilities of statistical timing are used to model the anti-correlated parameters.

Figure 5:
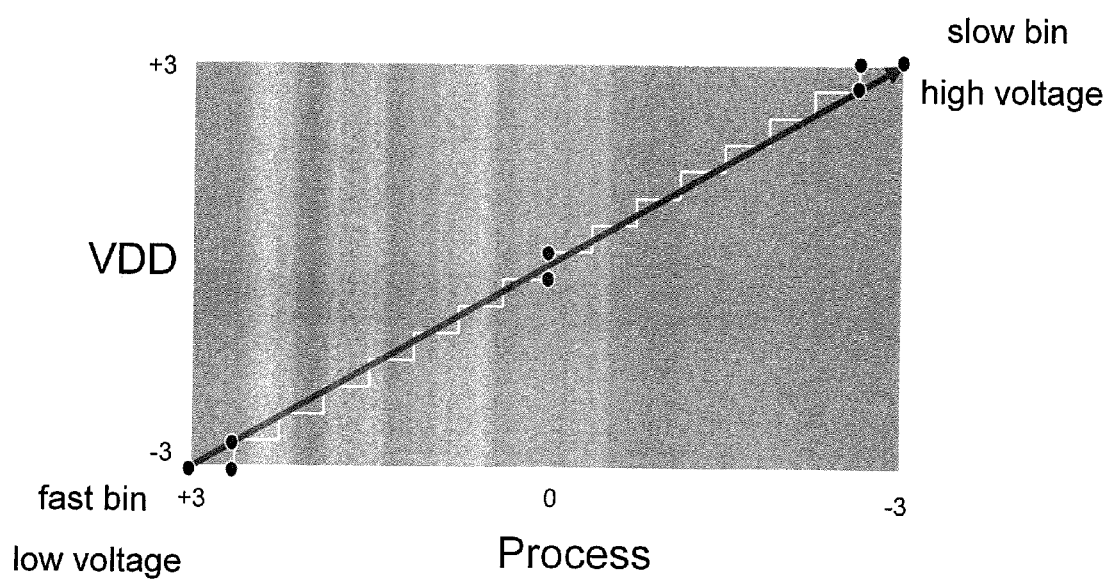
FIG. 5 is a graph that shows an exemplary correlation between two parameters in accordance with aspects of the invention.

As illustrated in FIG. 5, the delay increases when moved from the fast (+3) to the slow process (−3) and the delay decreases when moved from the low (−3) to the high Vdd (+3), which means the supply voltage and the process parameter are anti-correlated with each other in SVB. In embodiments, a correlation coefficient $\rho(P,Vdd)$ may be calculated using the following formula (4), which models deterministic supply voltage adjustment according to the process parameter. This correlation fits within the multi-bin subspace.

$$\rho(P, Vdd) = \frac{E(P, Vdd) - E(P)E(Vdd)}{\sigma_P \sigma_{Vdd}} = -1 \qquad (4)$$

where:
P=process parameter;
Vdd=supply voltage;
E=expected value; and
σ=standard deviation.

As further shown in FIG. 4, at step 420, the supply voltage and the process parameter are collapsed to a new single parameter. For example, the supply voltage and the process parameter are collapsed to a new parameter comprising a linear combination of the two parameters because the anti-correlation forces the two parameters to go in opposite directions. In embodiments, the new parameter "X" may be calculated using the following formula (5).

$$X = \alpha_1 P + \beta_1 Vdd \qquad (5)$$

where:
$\rho = -1$
$\alpha_1$=a multiplier for linear combination sensitivities;
$\beta_1$=a multiplier for liner combination sensitivities;
P=the process parameter; and
Vdd=the supply voltage.

At step 430, an SSTA may be computed for a netlist of the integrated circuit by treating sources of variation as Gaussian. In embodiments, the SSTA propagates the timing analysis with the new parameter "X." At step 440, the new single parameter "X" may be added to an RSS list. In accordance with aspects of the invention, the RSS list may be specified for statistical sources of variation. For example, the statistical sources of variation may include any variation that is Gaussian including metal layer variation, systematic sources of variation, random sources of variation, and the new single parameter.

At step 450, the new single parameter may be used to efficiently project the slack. For example, the following formula (6) may be used for efficient slack projection. The slack projection takes into consideration the anti-correlated new single parameter and its affect on the required arrival times and the arrival times of the integrated circuit.

$$a_0 - 3 \sum_{Environment} |a_i^{Env}| - \qquad (3)$$
$$3 \left\{ \sum_{RSS\_LIST} \left(a_i^{RSS\_LIST}\right)^2 + \sum_{CorrelationList} |\rho| * a_{i1} * a_{i2} \right\}^{1/2}$$

At step 460, reports may be generated. For example, the reports may comprise any timing quantity including the required arrival times, the arrival times, the slack projection, and the transition time or slew rate for the integrated circuit obtained from the SSTS. The generated reports can then be used to place the integrated chip into the correct bin of the multi-bin SVB process.

Figure 6:
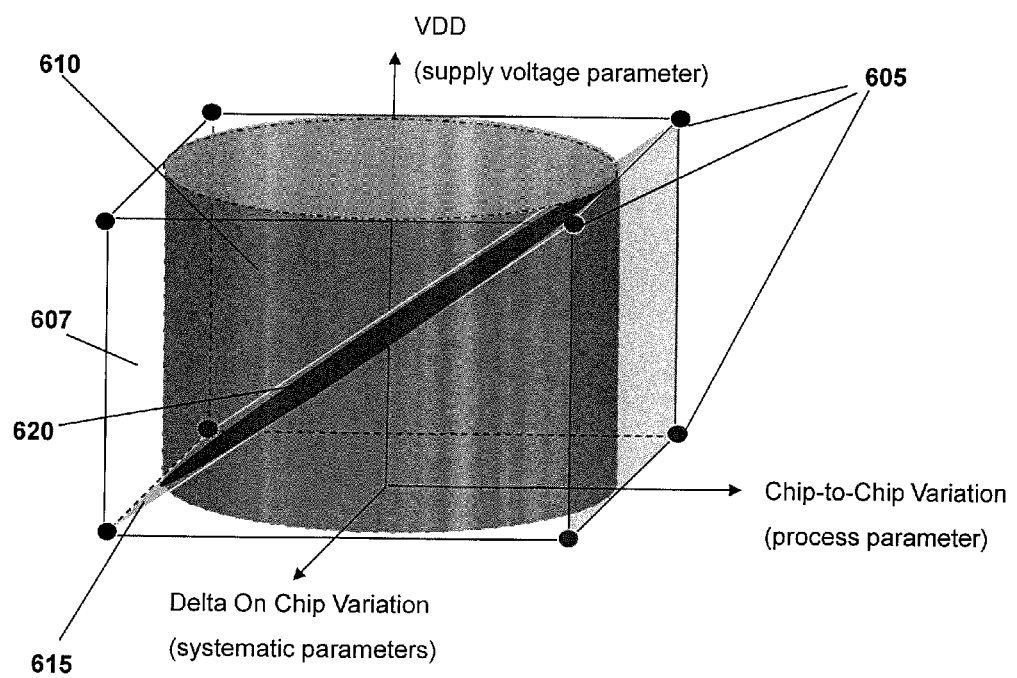
FIG. 6 illustrates advantages of the exemplary invention.

Advantageously, the system and method of SSTA 200/400 improves the performance of timing analysis by closing to a less pessimistic timing slack. For example, FIG. 6 illustrates this advantage of using the system and method of SSTA 200/400. The eight possible corners 605 are projections at which gates of the integrated circuit have the worst combinations of delays. The box 607 represents results of the traditional conservative way to handle variation by taking into consideration the process corners 605 at which the gates have the worst combinations of delays.

The graphical representation 610 represents the RSS of three sources of variation, e.g., the systematic parameters, the process parameter, and the supply voltage parameter. The graphical representation 610 does not extend to the corners 605 so there is some reduction in pessimism because the results do not extend to the worst combinations of delays. The cross section 615 represents the anti-correlation between the process parameter and the supply voltage parameter within an n-dimensional parameter space.

The subspace 620 of cross section 615 represents the RSS of all three sources of variation within the anti-correlated parameter space as calculated and described above in the system and method of SSTA 400. As can be seen in FIG. 6, the subspace 620 is representative of the system and method of SSTA 200/400, which significantly reduces pessimism over the use of the process corners or the RSS list alone.

Figure 7:
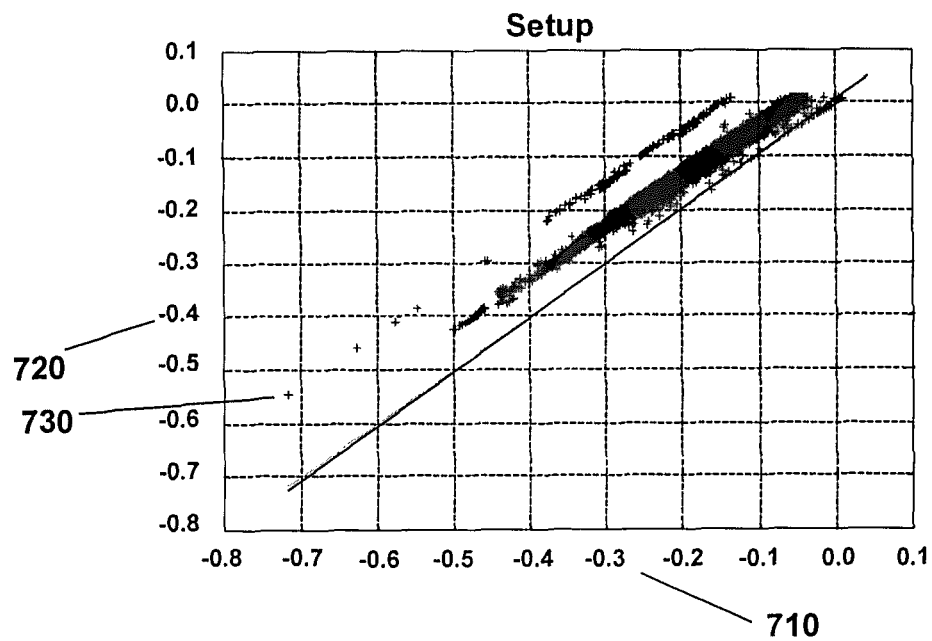
FIGS. 7 and 8 are graphs that illustrate advantages of the exemplary invention.
Figure 8:
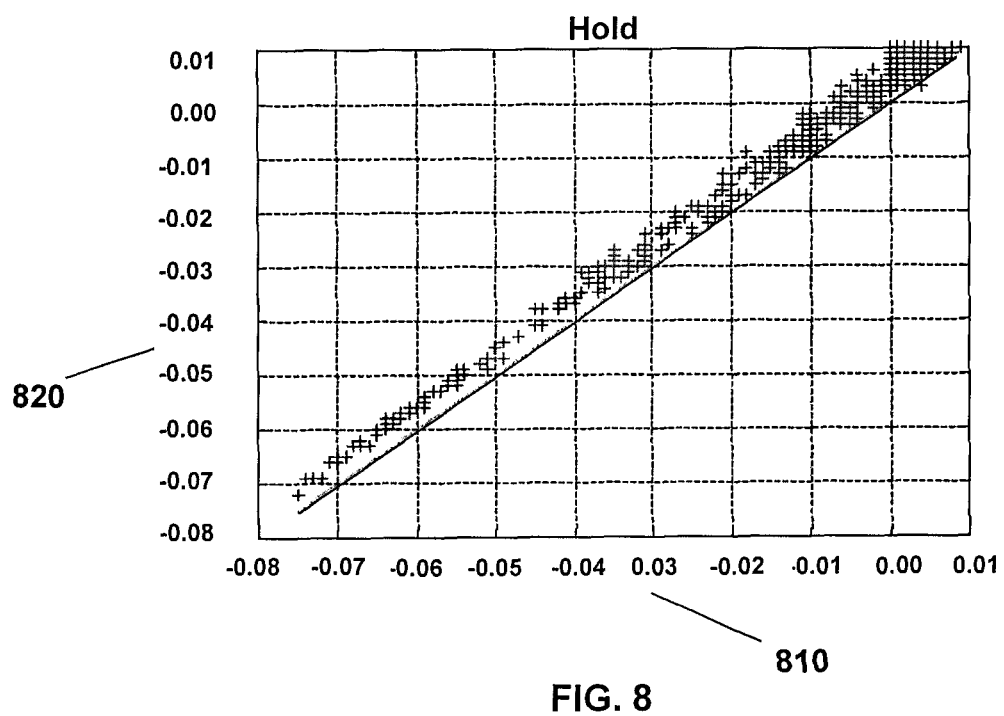

FIGS. 7 and 8 illustrate the improvement in slack projection accomplished in two different timing tests (e.g., setup and hold) of an integrated circuit implementing the present invention. The x-axis 710 and 810 are representative of slack measurements without using the correlation of parameters. The y-axis 720 and 820 are representative of slack measurements using the system and method of SSTA 200. For example, as can be seen via the exemplary data point 730 in FIG. 7, the projected slack without correlation is about −0.72, whereas the projected slack with correlation is about −0.55. Thus, advantageously using the system and method of SSTA 200 a significant improvement in slack projection is possible.

Figure 9:
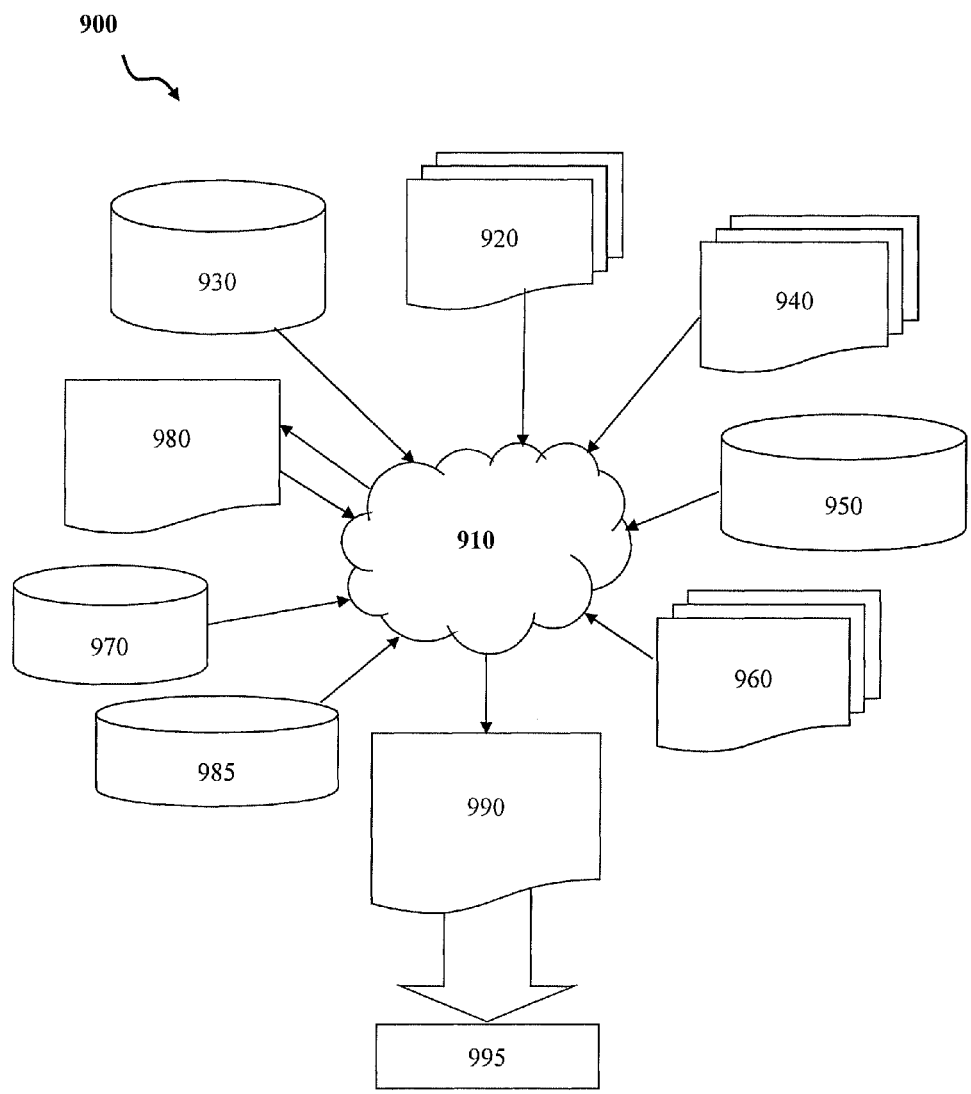
FIG. 9 is a flow diagram of a design process used in semiconductor design, manufacture, and/or test.

FIG. 9 is a flow diagram of a design process used in semiconductor design, manufacture, and/or test used with the system and method of the present invention. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system, which can be implemented with the method and system of the present invention. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more devices. In one embodiment, design structure 990 may comprise a compiled, executable HDL simulation model that functionally simulates the devices.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method for accommodating correlated parameters in statistical static timing analysis (SSTA), comprising:
    determining a correlation between at least two parameters;
    calculating a new parameter or new parameter set based on the correlation between the at least two parameters, the calculating comprising:
        calculating a correlation coefficient for the at least two parameters, the correlation coefficient being a measurement of a degree of a linear relationship between the at least two parameters; and
        calculating the new parameter as a linear combination of the at least two parameters when the calculated correlation coefficient is −1 or 1, or calculating the new parameter set as a transformation of the at least two parameters when the calculated correlation coefficient is not −1 or 1;
    performing the SSTA such that the new parameter or the new parameter set is propagated into the SSTA as the linear combination of the at least two parameters or the transformation of the at least two parameters rather than the at least two parameters separately; and
    projecting slack using the correlation between the at least two parameters and using a processor.

2. The method of claim 1, further comprising specifying a root sum of squares (RSS) list for statistical sources of variation that provides a reduction in overall variance, and adding the new parameter or the new parameter set to the RSS list.

3. The method of claim 2, further comprising returning the new parameter or the new parameter set back to the at least two parameters prior to the projecting the slack.

4. The method of claim 1, wherein the correlation is determined by at least one of: (1) physics of devices on an integrated circuit, (2) manufacturing process of the integrated circuit, and (3) architecture of the integrated circuit.

5. The method of claim 1, wherein the calculating the new parameter or the new parameter set comprises generating a covariance matrix of the at least two parameters.

6. The method of claim 1, further comprising returning the new parameter or the new parameter set back to the at least two parameters prior to the projecting the slack.

7. The method of claim 1, further comprising loading a design of an integrated circuit or specified testing region of the integrated circuit and timing models into a computing device, wherein the at least two parameters are obtained from the integrated circuit or the specified testing region of the integrated circuit and the projected slack is for the integrated circuit or the specified testing region of the integrated circuit.

8. The method of claim 1, wherein:
the at least two parameters comprise a process and a process parameter; and
the new parameter or the new parameter set is calculated using at least a first multiplier for linear combination sensitivities for the process and a second multiplier for linear combination sensitivities for the process parameter.

9. A computer system for accommodating correlated parameters in statistical static timing analysis (SSTA), the system comprising:
a CPU, a computer readable memory and a computer readable storage media;
program instructions to determine a correlation between at least two parameters;
program instructions to calculate a new parameter or a new parameter set based on the correlation between the at least two parameters, the calculating comprising:
calculating a correlation coefficient for the at least two parameters, the correlation coefficient being a measurement of a degree of a linear relationship between the at least two parameters; and
calculating the new parameter as a linear combination of the at least two parameters when the calculated correlation coefficient is −1 or 1, or calculating the new parameter set as a transformation of the at least two parameters when the calculated correlation coefficient is not −1 or 1;
program instructions to perform the SSTA such that the new parameter or the new parameter set is propagated into the SSTA as the linear combination of the at least two parameters or the transformation of the at least two parameters rather than the at least two parameters separately; and
program instructions to project slack using the correlation between the at least two parameters,
wherein the program instructions are stored on the computer readable storage media for execution by the CPU via the computer readable memory.

10. The system claim 9, further comprising:
program instructions to load a design of an integrated circuit or specified testing region of the integrated circuit and timing models into the computer system; and
program instructions to generate reports that include the projected slack.

11. The system of claim 10, further comprising program instructions to return the new parameter or the new parameter set back to the at least two parameters prior to the projecting the slack.

12. The system of claim 11, wherein the at least two parameters are obtained from the integrated circuit or the specified testing region of the integrated circuit and the projected slack is for the integrated circuit or the specified testing region of the integrated circuit.

13. The system of claim 12, wherein the correlation is determined by at least one of: (1) physics of devices on an integrated circuit, (2) manufacturing process of the integrated circuit, and (3) architecture of the integrated circuit.

14. The system of claim 13, wherein the calculating the new parameter or the new parameter set comprises generating a covariance matrix of the at least two parameters.

15. The system of claim 14, further comprising program instructions to specify a root sum of squares (RSS) list for statistical sources of variation that provides a reduction in overall variance, and adding the new parameter or the new parameter set to the RSS list.

16. The system of claim 9, wherein:
the at least two parameters comprise a process and a process parameter; and
the new parameter or the new parameter set is calculated using at least a first multiplier for linear combination sensitivities for the process and a second multiplier for linear combination sensitivities for the process parameter.

* * * * *